United States Patent
Woo et al.

(10) Patent No.: US 8,053,968 B2
(45) Date of Patent: Nov. 8, 2011

(54) LIGHT SOURCE MODULE, BACKLIGHT ASSEMBLY HAVING THE SAME, DISPLAY APPARATUS HAVING THE BACKLIGHT ASSEMBLY, AND METHOD THEREOF

(75) Inventors: Seung-Gyun Woo, Masan-si (KR); Young-Bee Chu, Suwon-si (KR); Ik-Soo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 90 days.

(21) Appl. No.: 12/110,486

(22) Filed: Apr. 28, 2008

(65) Prior Publication Data

US 2008/0291365 A1 Nov. 27, 2008

(30) Foreign Application Priority Data

May 25, 2007 (KR) .................. 10-2007-0050619

(51) Int. Cl.
*H05B 33/04* (2006.01)

(52) U.S. Cl. ............. 313/498; 349/65; 349/69; 362/612

(58) Field of Classification Search .................... 349/65, 349/69; 362/612, 632–634; 257/99, 79
See application file for complete search history.

(56) References Cited

U.S. PATENT DOCUMENTS

| | | | |
|---|---|---|---|
| 6,054,716 A | | 4/2000 | Sonobe et al. |
| 2002/0001192 A1* | | 1/2002 | Suehiro et al. ............... 362/240 |
| 2005/0141241 A1 | | 6/2005 | Ohkawa |
| 2005/0236634 A1 | | 10/2005 | Fujii |
| 2006/0131591 A1* | | 6/2006 | Sumitani ........................ 257/79 |
| 2007/0001187 A1 | | 1/2007 | Kim |
| 2009/0015754 A1* | | 1/2009 | Pai ................................. 349/65 |

FOREIGN PATENT DOCUMENTS

| | | |
|---|---|---|
| CN | 1189951 C | 2/2005 |
| CN | 1624944 A | 6/2005 |
| CN | 1892361 A | 1/2007 |
| CN | 1926694 A | 3/2007 |
| EP | 1 189 292 A1 | 3/2002 |
| EP | 1189292 A1 | 3/2002 |
| EP | 1770796 A1 | 4/2007 |
| JP | 08-201805 | 8/1996 |
| JP | 2005260276 | 9/2005 |
| JP | 2005260276 A | 9/2005 |
| JP | 2007041263 A | 2/2007 |

(Continued)

OTHER PUBLICATIONS

Machine Translation of WO 2005/091383 to Ohno et al.*
European Search Report dated Jan. 13, 2009 for Application No. 08005720.1-2216/1995795.

(Continued)

*Primary Examiner* — Toan Ton
*Assistant Examiner* — Andrew Coughlin
(74) *Attorney, Agent, or Firm* — Cantor Colburn LLP

(57) ABSTRACT

A light source module includes a power supply plate, a light emitting chip, and a body mold. The light emitting chip is disposed on the power supply plate to lean to one side with respect to a center of the power supply plate along a first direction and electrically connected to the power supply plate. The body mold is connected with the power supply plate to expose the light emitting chip. Therefore, a thickness of a backlight assembly employing the light source module may be reduced.

20 Claims, 7 Drawing Sheets

FOREIGN PATENT DOCUMENTS

| | | | |
|---|---|---|---|
| KR | 1020060104795 | A | 10/2006 |
| KR | 1020070017837 | A | 2/2007 |
| WO | 2007034537 | A1 | 3/2007 |
| WO | 2007041402 | A2 | 4/2007 |

OTHER PUBLICATIONS

European Search Report in regards to Application No. 08005720.1-2216; Dated: Sep. 25, 2008.

* cited by examiner

LIGHT SOURCE MODULE, BACKLIGHT ASSEMBLY HAVING THE SAME, DISPLAY APPARATUS HAVING THE BACKLIGHT ASSEMBLY, AND METHOD THEREOF

This application claims priority to Korean Patent Application No. 2007-50619, filed on May 25, 2007, and all the benefits accruing therefrom under 35 U.S.C. §119, the contents of which in its entirety are herein incorporated by reference.

BACKGROUND OF THE INVENTION

1. Field of the Invention

The present invention relates to a light source module, a backlight assembly having the light source module, a display apparatus having the backlight assembly, and a method thereof. More particularly, the present invention relates to a light source module having a light emitting chip, a backlight assembly having the light source module, a display apparatus having the backlight assembly, and a method of reducing a thickness of the backlight assembly.

2. Description of the Related Art

A liquid crystal display ("LCD") apparatus has various properties, such as a thin thickness, a light weight, low power consumption, etc. Therefore, the LCD apparatus is mainly used for a monitor, a notebook computer, a mobile phone, and a large television set. The LCD apparatus includes an LCD panel and a backlight assembly. The LCD panel displays an image by using light passing through a liquid crystal layer. The backlight assembly is disposed under the LCD panel and provides the LCD panel with light.

The backlight assembly employed by an LCD apparatus having a small size includes a light source module and a light guide plate. The light source module includes a light emitting chip that generates light. A side surface of the light guide plate faces the light source module. Since the side surface of the light guide plate faces the light source module, the light guide plate has a thickness corresponding to the light source module.

BRIEF SUMMARY OF THE INVENTION

In a conventional backlight assembly, since a light guide plate has a thickness corresponding to a light source module, a thickness of the backlight assembly may increase, and as a result, a thickness of a liquid crystal display ("LCD") apparatus having the backlight assembly may increase.

The present invention provides a light source module capable of reducing a thickness of a light guide plate.

The present invention further provides a backlight assembly having the light source module.

The present invention still further provides a display apparatus having the backlight assembly.

The present invention further provides a method of reducing a thickness of the backlight assembly.

A light source module according to an exemplary embodiment of the present invention includes a power supply plate, a light emitting chip and a body mold. The light emitting chip is disposed on the power supply plate to lean to one side of the power supply plate with respect to a center of the power supply plate along a first direction and electrically connected to the power supply plate. The body mold is connected with the power supply plate to expose the light emitting chip.

The power supply plate may be extended in a second direction substantially perpendicular to the first direction. The power supply plate may include a first power supply plate and a second power supply plate. The first power supply plate may apply a first voltage to the light emitting chip. The second power supply plate may be spaced apart from the first power supply plate toward the second direction and apply a second voltage different from the first voltage to the light emitting chip.

The first power supply plate may include a first main body and a first sub body. The first main body may be electrically connected to the light emitting chip. The first sub body may be connected to the first main body to receive the first voltage from an external device. The second power supply plate may include a second main body and a second sub body. The second main body may be spaced apart from the first main body toward the second direction and may be electrically connected to the light emitting chip. The second sub body may be connected to the second main body to receive the second voltage from the external device.

The light source module may further include a fluorescent material. The fluorescent material may fill an opening formed through the body mold and cover the light emitting chip. The light emitting chip may include a blue light emitting diode ("LED") generating blue light, and the fluorescent material may include a yellow phosphor changing the blue light into white light. Additionally, the light source module may further include a Zener diode to prevent any extra voltage from flowing to the light emitting chip.

A backlight assembly according to another exemplary embodiment of the present invention includes a light source module and a light guide plate. The light source module includes a power supply plate, a light emitting chip and a body mold. The light emitting chip is disposed on the power supply plate to lean to a first side of the power supply plate with respect to a center of the power supply plate along a first direction and electrically connected to the power supply plate. The body mold is connected with the power supply plate to expose the light emitting chip. The light guide plate includes a side surface facing the light emitting chip and receiving light generated by the light emitting chip, and a light exiting surface through which the light received through the side surface exits from the light guide plate.

The power supply plate may be extended in a second direction substantially perpendicular to the first direction. A thickness of the light guide plate may correspond to a width of the light emitting chip along the first direction. Alternately, the thickness of the light guide plate may correspond to a width of an opening formed through the body mold along the first direction.

The backlight assembly may further include at least one optical sheet. The optical sheet may be disposed on the light guide plate to improve optical properties of light emitted from the light guide plate. A total thickness of the optical sheet and the light guide plate may correspond to a width of the light source module along the first direction.

The backlight assembly may further include a flexible circuit board. The flexible circuit board may be electrically connected to the light source module to provide the light source module with an electric power. The flexible circuit board may be disposed at a second side of the power supply plate opposite to the first side of the power supply plate in which the light emitting chip is disposed. The flexible circuit board may face the body mold.

A display apparatus according to still another exemplary embodiment of the present invention includes a display panel and a backlight assembly. The display panel displays an image using light. The backlight assembly includes a light source module and a light guide plate.

The light source module includes a power supply plate, a light emitting chip and a body mold. The light emitting chip is disposed on the power supply plate to lean to a first side of the power supply plate with respect to a center of the power supply plate along a first direction and electrically connected to the power supply plate. The body mold is connected with the power supply plate to expose the light emitting chip. The light guide plate includes a side surface facing the light emitting chip and receiving light generated by the light emitting chip, and a light exiting surface through which the light received through the side surface exits from the light guide plate toward the display panel.

The backlight assembly may further include a flexible circuit board. The flexible circuit board may be electrically connected to the light source module to provide the light source module with an electric power. The flexible circuit board may be disposed at a second side of the power supply plate opposite to the first side of the power supply plate in which the light emitting chip is disposed, and faces the body mold. The flexible circuit board may be attached and fixed at a lower surface of the display panel.

A method of reducing a thickness of a backlight assembly according to yet another exemplary embodiment of the present invention includes providing a power supply plate with a width in a first direction and a length in a second direction, the power supply plate having a first long side and a second long side extending in the second direction, disposing a light emitting chip having a width in the first direction and a length in the second direction on the power supply plate closer to the first long side than to the second long side, surrounding the power supply plate with a body mold and exposing the light emitting chip through an opening in the body mold, the opening having a width in the first direction, and arranging a light guide plate adjacent the opening in the body mold, a thickness of the light guide plate being less than or substantially equal to the width of the opening.

According to the light source module, the backlight assembly having the light source module, the display apparatus having the backlight assembly, and the method of reducing a thickness of the backlight assembly, the light emitting chip is disposed to lean to one side, with respect to a center of a power supply plate on which the light emitting chip is disposed, along the first direction. Therefore, the thickness of the light guide plate may decrease so that the thickness of the display apparatus may decrease.

BRIEF DESCRIPTION OF THE DRAWINGS

The above and other features and advantages of the present invention will become more apparent by describing in detailed exemplary embodiments thereof with reference to the accompanying drawings, in which.

DETAILED DESCRIPTION OF THE INVENTION

Figure 1:
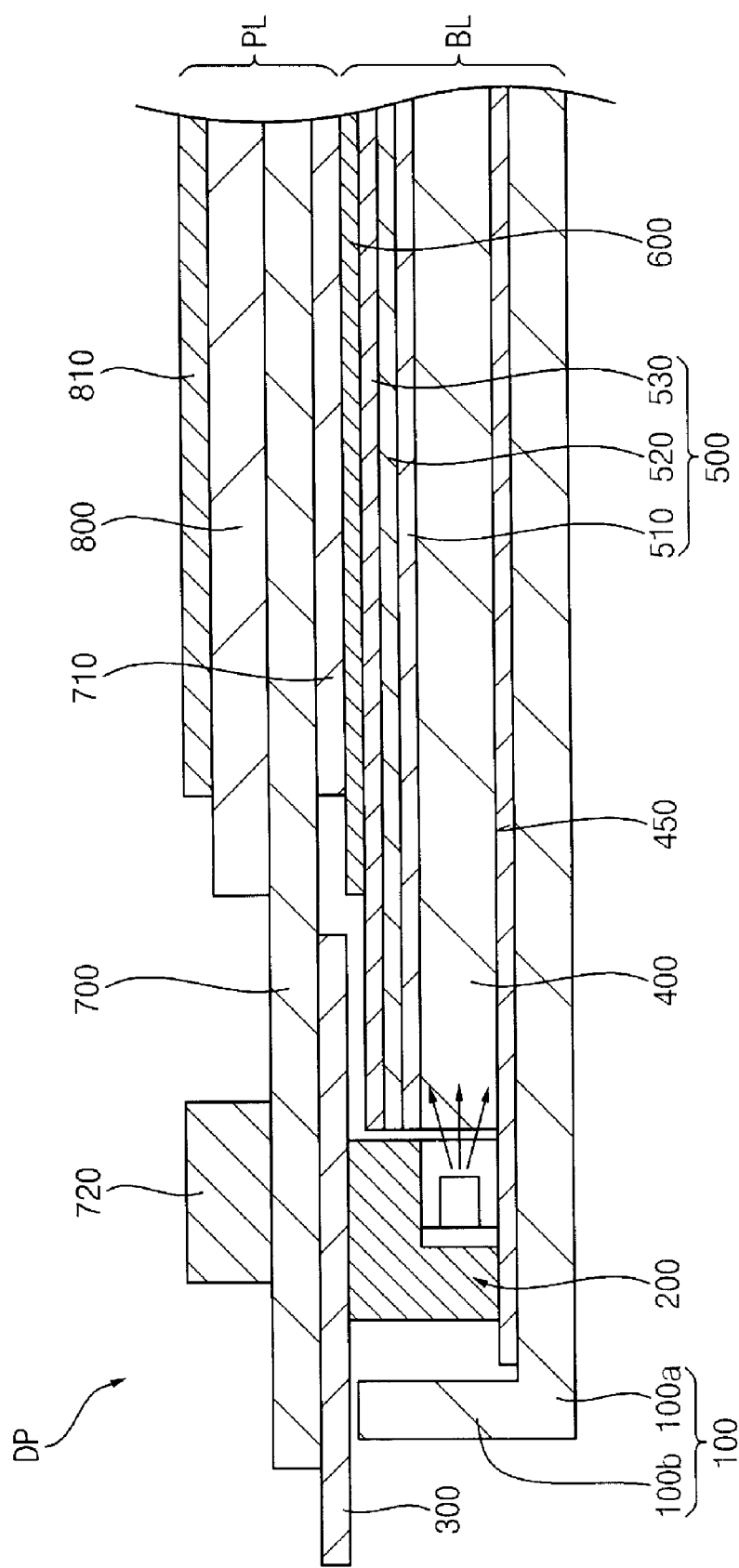
FIG. 1 is a cross-sectional view illustrating an exemplary display apparatus according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a cross-sectional view illustrating an exemplary display apparatus according to an exemplary embodiment of the present invention.

Referring to FIG. 1, a display apparatus DP according to an exemplary embodiment of the present invention includes a backlight assembly BL and a display panel PL. The backlight assembly BL generates light. The display panel PL displays an image by using the light generated by the backlight assembly BL.

The backlight assembly BL includes a receiving container 100, a light source module 200, a flexible circuit board 300, a light guide plate 400, a reflective sheet 450, an optical member 500, and an adhesive sheet 600.

The receiving container 100 includes a bottom plate 100a and a sidewall 100b extended from an edge portion of the bottom plate 100a. The bottom plate 100a and the sidewall 100b define a receiving space. The receiving container 100 receives the light source module 200, the flexible circuit board 300, the light guide plate 400, the reflective sheet 450, the optical member 500, and the adhesive sheet 600. Although not shown, an end of the flexible circuit board 300 may wrap around the sidewall 100b or the bottom plate 100a of the receiving container 100.

The light source module 200 is received in the receiving space. For example, the light source module 200 may be disposed adjacent to an interior surface of the sidewall 100b of the receiving container 100. The light source module 200 generates light along a direction substantially parallel to the bottom plate 100a of the receiving container 100. The light source module 200 will be further described below.

The flexible circuit board 300 is electrically connected to the light source module 200. The flexible circuit board 300 supplies the light source module 200 with an electric power. For example, the light source module 200 may be disposed on the flexible circuit board 300, such as on a lower surface of the flexible circuit board 300, so that the light source module 200 is electrically connected to the flexible circuit board 300 and receives the electric power from the flexible circuit board 300.

The light guide plate 400 includes an upper surface, a lower surface opposite to the upper surface, and a side surface connecting the upper surface to the lower surface. The light guide plate 400 is received by the receiving container 100 and the side surface of the light guide plate 400 faces the light source module 200. The light generated by the light source module 200 enters the light guide plate 400 through the side surface of the light guide plate 400. The light guide plate 400 guides the light and the guided light exits from the light guide plate 400 through the upper surface of the light guide plate 400. The light guide plate 400 may include a plurality of reflective dots (not shown) formed on the lower surface of the light guide plate 400. Alternatively, the light guide plate 400 may include ridges, grooves, or other reflective elements on the lower surface of the light guide plate 400 or within the light guide plate 400 to direct light towards the upper surface of the light guide plate 400.

The reflective sheet 450 is disposed between the light guide plate 400 and the bottom plate 100a of the receiving container 100. The reflective sheet 450 reflects light that exits from the light guide plate 400 through the lower surface of the light guide plate 400 back towards the light guide plate 400, so that the reflected light enters the light guide plate 400. The reflective sheet 450 may be extended along the bottom plate 100a of the receiving container 100 to cover a lower portion of the light source module 200. In an alternative exemplary embodiment, the bottom plate 100a may be provided with a reflective coating in place of the reflective sheet 450.

The optical member 500 is disposed on the light guide plate 400. The optical member 500 improves optical properties of light that exits from the light guide plate 400 through the upper surface of the light guide plate 400. The optical member 500 may include at least one optical sheet capable of improving the optical properties of the light that exits from the light guide plate 400 through the upper surface of the light guide plate 400.

For example, the optical member 500 may include a diffusive sheet 510, and a first prism sheet 520 and a second prism sheet 530. The diffusive sheet 510 diffuses the light to improve brightness uniformity of the light. The first and second prism sheets 520 and 530 concentrate the light to improve front-view brightness. For example, the diffusive sheet 510 may have a thickness of about 58 μm, and the first and second prism sheets 520 and 530 may have a thickness of about 65 μm. Therefore, the optical member 500 may have a thickness of about 0.188 mm. Although a particular example of the optical member 500 has been described, alternative exemplary embodiments of the optical member 500 having various optical sheets with varying dimensions are also within the scope of these embodiments.

The adhesive sheet 600 is disposed between the optical member 500 and the display panel PL. The adhesive sheet 600 may have a rectangular frame shape of which a center portion is opened to transmit light. Alternatively, the adhesive sheet 600 may include a transparent material to transmit light.

The adhesive sheet 600 may adhere to an edge portion of the optical member 500 and the sidewall 100b of the receiving container 100 to combine the optical member 500 with the receiving container 100. When the optical member 500 is combined with the receiving container 100 by the adhesive sheet 600, the other components may be fixed to the receiving container 100. Alternatively, the optical member 500 may adhere to a lower surface of the display panel PL through the adhesive sheet 600 as shown. When the optical member 500 adheres to the lower surface of the display panel PL through the adhesive sheet 600, the backlight assembly BL may adhere to the lower surface of the display panel PL.

The display panel PL includes a first substrate 700, a second substrate 800 opposite to the first substrate 700, and a liquid crystal layer (not shown) disposed between the first substrate 700 and the second substrate 800.

Although not shown, the first substrate 700 includes a signal line, a thin film transistor ("TFT"), and a pixel electrode. The signal line receives a driving signal. The TFT is electrically connected to the signal line. The pixel electrode is electrically connected to the TFT and includes a transparent conductive material. A first polarizing plate 710 may be disposed on a lower surface of the first substrate 700. The first polarizing plate 710 has a first polarization axis. A driving chip 720 may be disposed on an upper surface of the first substrate 700. The driving chip 720 applies the driving signal to the signal line.

The second substrate 800 includes a color filter (not shown) corresponding to the pixel electrode and a common electrode (not shown) formed on an entire surface, or substantially an entire surface, of the second substrate 800. The common electrode may include a transparent conductive material. The color filter may include a red color filter, a green color filter, and a blue color filter. Alternatively, the color filter may be formed on the first substrate 700. A second polarizing plate 810 may be disposed on an upper surface of the second substrate 800. The second polarizing plate 810 has a second polarization axis substantially perpendicular to the first polarization axis.

The liquid crystal layer is disposed between the first and second substrates 700 and 800. The liquid crystal layer includes liquid crystal molecules of which arrangement is changed by an electric field formed between the pixel electrode and the common electrode. An amount of light passing through the liquid crystal layer is controlled by the arrangement of the liquid crystal molecules.

The flexible circuit board 300 is disposed on the lower surface of the display panel PL. For example, an upper surface of the flexible circuit board 300 may adhere to the lower surface of the first substrate 700. The light source module 200 may be disposed on a lower surface of the flexible circuit board 300. Alternatively, the lower surface of the flexible circuit board 300 may partially adhere to the edge portion of the adhesive sheet 600.

When the flexible circuit board 300 adheres to the lower surface of the display panel PL, the light source module 200 disposed on the flexible circuit board 300 is prevented from being moved by an external impact.

Figure 2:
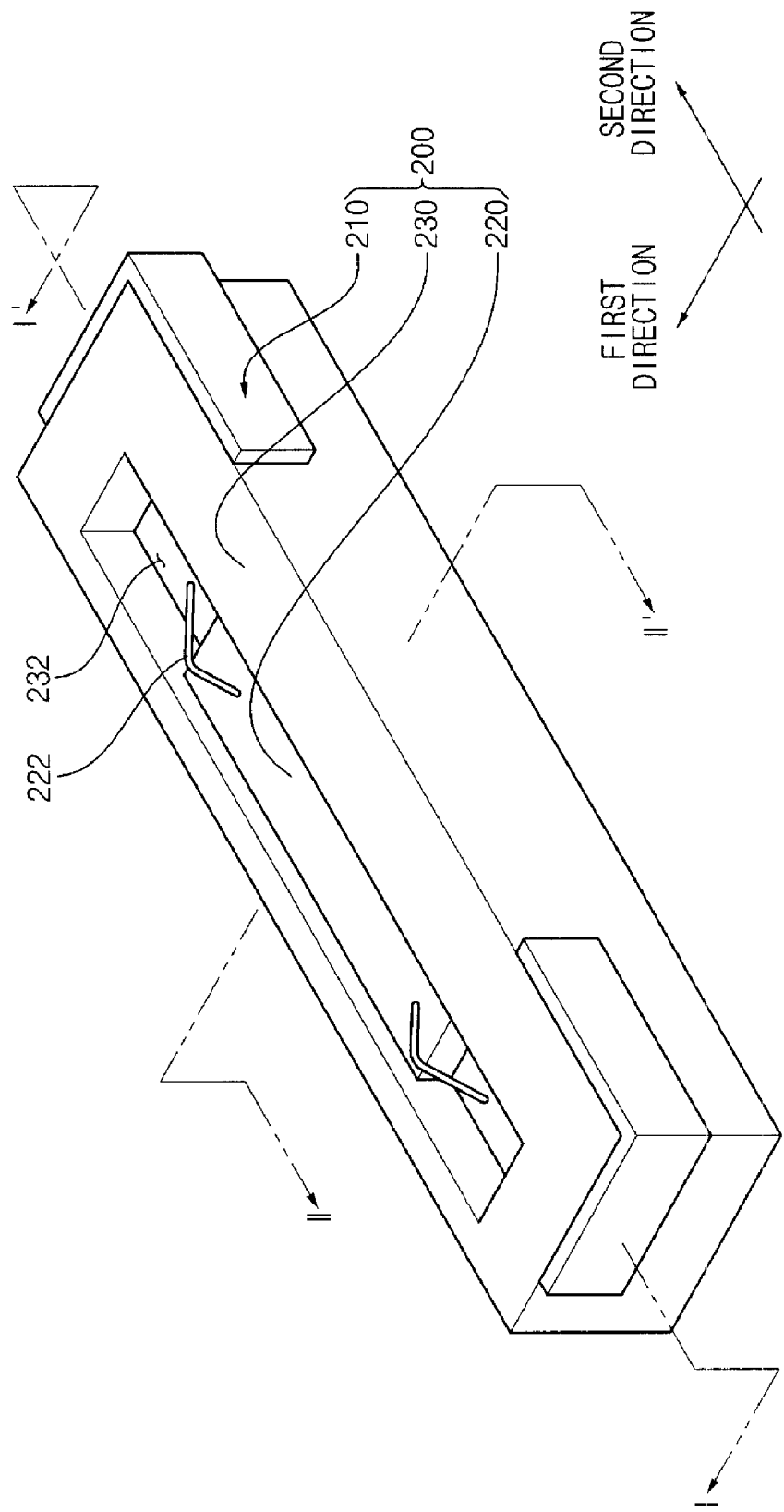
FIG. 2 is a perspective view illustrating an exemplary light source module shown in FIG. 1.
Figure 3:
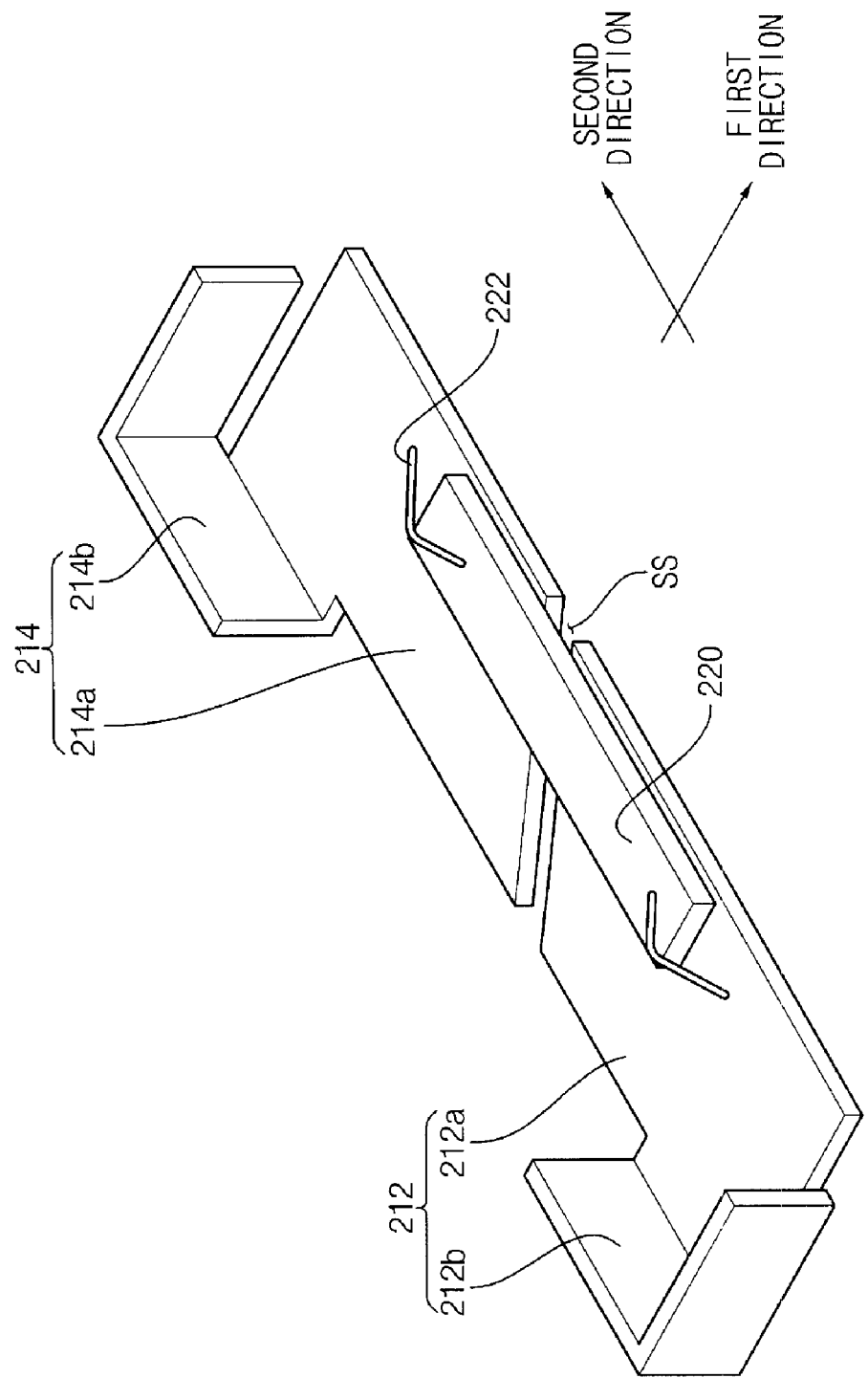
FIG. 3 is another perspective view illustrating the exemplary light source module without an exemplary mold body shown in FIG. 2.
Figure 4:
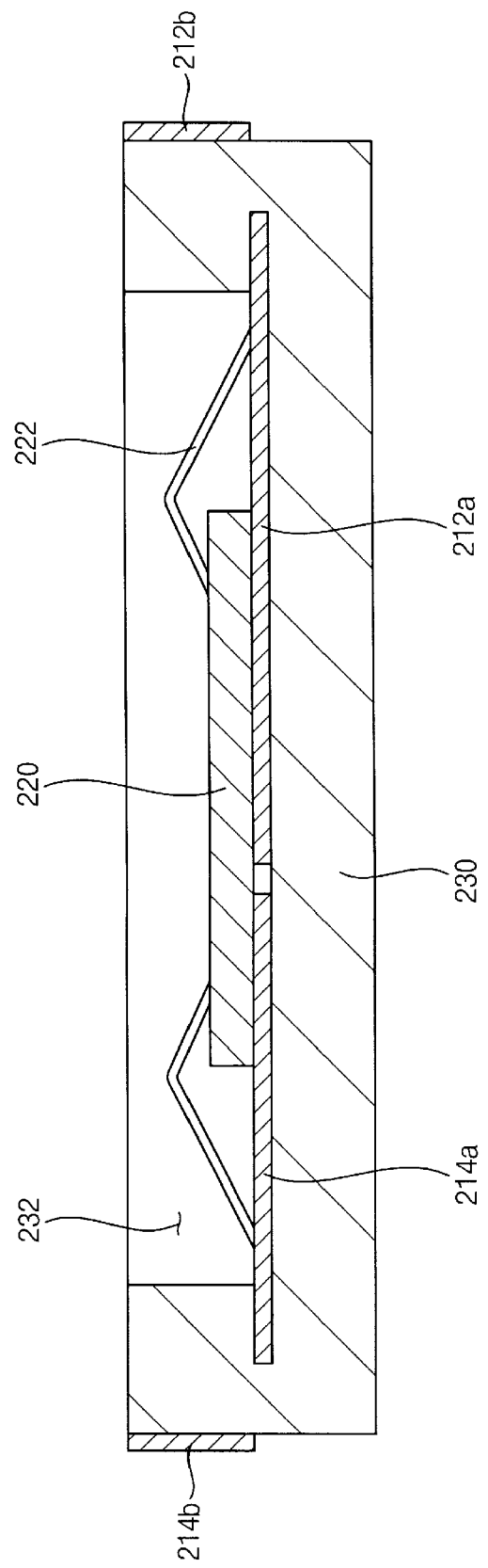
FIG. 4 is a cross-sectional view taken along line I-I' shown in FIG. 2.

FIG. 2 is a perspective view illustrating an exemplary light source module shown in FIG. 1. FIG. 3 is another perspective view illustrating the exemplary light source module shown in FIG. 2, which excludes an exemplary body mold. FIG. 4 is a cross-sectional view taken along line I-I' shown in FIG. 2.

Referring to FIGS. 1 to 4, the light source module 200 includes a power supply plate 210, a light emitting chip 220 and a body mold 230. The light emitting chip 220 is disposed on the power supply plate 210. At least a portion of the body mold 230 is connected with the power supply plate 210.

The power supply plate 210 may have a predetermined width along a first direction. The power supply plate 210 may be extended in a second direction substantially perpendicular to the first direction and have a predetermined length. For example, the length of the power supply plate 210 is larger than the width of the power supply plate 210.

The power supply plate 210 includes a first power supply plate 212 and a second power supply plate 214. The first power supply plate 212 applies a first voltage to the light emitting chip 220. The second power supply plate 214 applies a second voltage different from the first voltage to the light emitting chip 220.

The first power supply plate 212 includes a first main body portion 212a and a first sub body portion 212b. The first main body portion 212a is electrically connected to the light emitting chip 220. The first main body portion 212a extends a first portion of the length of the power supply plate 210. The first sub body portion 212b is connected to the first main body portion 212a and receives the first voltage from an external device. The first sub body portion 212b may extend in a direction substantially perpendicular to a surface of the first main body portion 212a.

The second power supply plate 214 includes a second main body portion 214a and a second sub body portion 214b. The second main body portion 214a is spaced apart from the first main body portion 212a toward the second direction and electrically connected to the light emitting chip 220. The second main body portion 214a extends a second portion of the length of the power supply plate 210. The second sub body portion 214b is connected to the second main body portion 214a and receives the second voltage from the external device. The second sub body portion 214b may extend in a direction substantially perpendicular to a surface of the second main body portion 214a.

The first and second main body portions 212a and 214a may be extended in the second direction. The first main body portion 212a may have a same width as the second main body portion 214a.

The first and second main body portions 212a and 214a may have a width of at least about 0.25 mm along the first direction. For example, the first and second main body portions 212a and 214a may have a width of about 0.25 mm to about 0.4 mm.

The first main body portion 212a may have a same length as the second main body portion 214a. Alternatively, the first main body portion 212a may have a length different from the second main body portion 214a. In exemplary embodiments, the first and second main body portions 212a and 214a may have a length of about 3 mm to about 4 mm. In one exemplary embodiment, the first and second main body portions 212a and 214a may each have a length of about 3.8 mm.

A separation space SS between the first and second main body portions 212a and 214a may be formed along the first direction. Alternatively, the separation space SS between the first and second main body portions 212a and 214a may be inclined against the first direction as shown in FIG. 3.

The first sub body portion 212b is connected to an end of the first main body portion 212a. The second sub body portion 214b is connected to an end of the second main body portion 214a opposite to the first sub body portion 212b. For example, the first sub body portion 212b may be substantially perpendicular to a surface of the first main body portion 212a and be connected to the end of the first main body portion 212a. The second sub body portion 214b may be substantially perpendicular to a surface of the first main body portion 212a and be connected to the end of the second main body portion 214a.

The first sub body portion 212b is electrically connected to the flexible circuit board 300 and receives the first voltage from the flexible circuit board 300. The second sub body portion 214b is electrically connected to the flexible circuit board 300 and receives the second voltage from the flexible circuit board 300.

The light emitting chip 220 is disposed on at least one of the first and second main body portions 212a and 214a. For example, the light emitting chip 220 may be disposed on the first and second main body portions 212a and 214a and overlapping the separation space SS as shown in FIG. 3. Alternatively, the light emitting chip 220 may be disposed on only one of the first and second main body portions 212a and 214a.

The light emitting chip 220 may be extended in the second direction, having a length in the second direction. A width of the light emitting chip 220 along the first direction may be about 0.075 mm to about 0.125 mm.

The light emitting chip 220 may be disposed leaning toward a first long side of the first and second main body portions 212a and 214a with respect to the first direction, of the first and second main body portions 212a and 214a. For example, the light emitting chip 220 may be disposed at the first long side of the first and second main body portions 212a and 214a, which is opposite to the first and second sub body portions 212b and 214b. In other words, the light emitting chip 220 is not centrally disposed on the power supply plate 210, but is instead offset towards a first side of the power supply plate 210.

A second long side of the first main body portion 212a with respect to the first direction may be connected to the first sub body portion 212b. A second long side of the second main body portion 214a with respect to the first direction may be connected to the second sub body portion 214b. The light emitting chip 220 is positioned closer to the first long side of the power supply plate 210 than the second long side of the power supply plate 210.

The light emitting chip 220 may be electrically connected to the first and second main body portions 212a and 214a by a pair of connection wires 222, respectively. The light emitting chip 220 receives the first voltage from the first main body portion 212a. The light emitting chip 220 also receives the second voltage from the second main body portion 214a. Alternatively, the light emitting chip 220 may be electrically connected to the first and second main body portions 212a and 214a not by the connection wire 222, but another connection member.

The light emitting chip 220 may include at least one of a red light emitting diode ("LED"), a green LED, and a blue LED. For example, the light emitting chip 220 may include all of the red LED, the green LED, and the blue LED to generate white light. Alternatively, the backlight assembly includes a first light source module having the red LED, a second light source module having the green LED, and a third light source module having the blue LED. Alternatively, the light emitting chip 220 may include a white LED to generate white light.

The body mold 230 is connected with the first and second main body portions 212a and 214a such that the body mold 230 exposes a portion of the light emitting chip 220. For example, an opening 232 is formed through the mold body 230 to expose the light emitting chip 220. Light generated by the light emitting chip 220 passes through the opening 232 and enters the light guide plate 400 through the side surface of the light guide plate 400 that faces the light source module 200.

For example, the body mold 230 may be formed through an injection molding method in which a molding solution is inserted into a mold to manufacture a product. After the body mold 230 is formed through the injection molding method, the first and second sub body portions 212b and 214b are bent along an outline of the body mold 230. As a result, the first and second sub body portions 212b and 214b may be bent to be at an angle from the first and second main body portions 212a and 214a, such as to substantially have right angle shapes, such as an L-shape.

Figure 5:
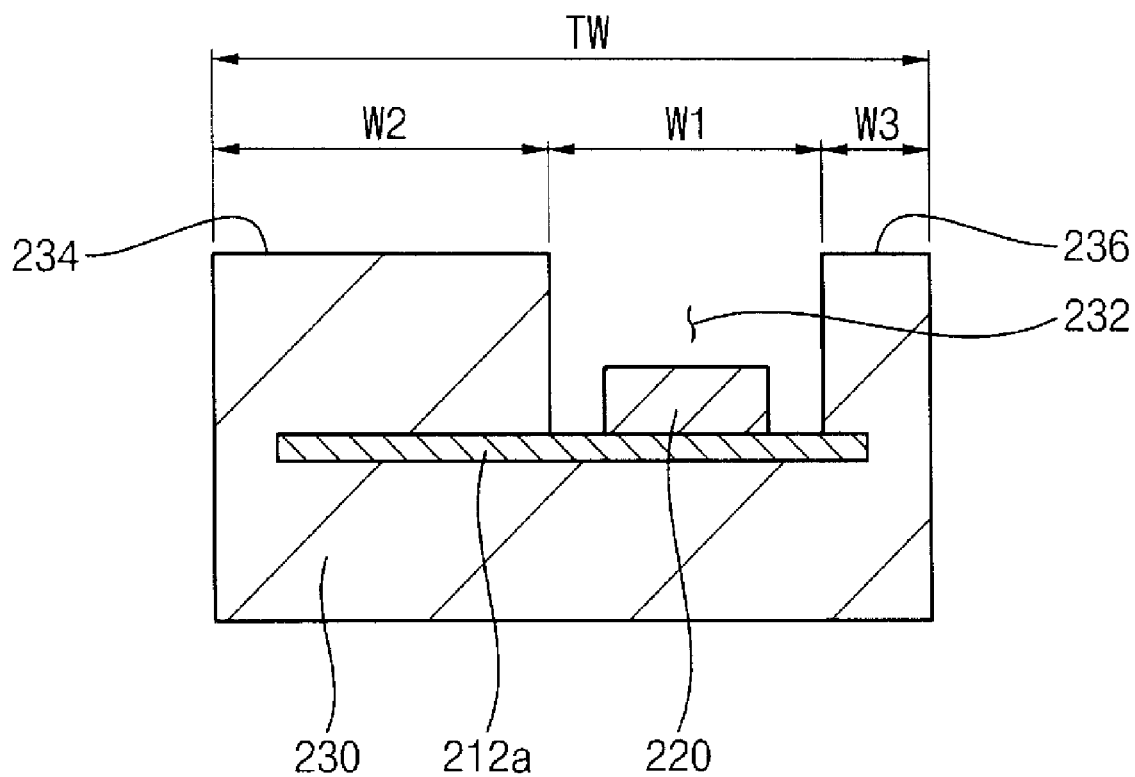
FIG. 5 is a cross-sectional view taken along line II-II' shown in FIG. 2.

FIG. 5 is a cross-sectional view taken along line II-II' shown in FIG. 2.

Referring to FIGS. 1, 2, and 5, a surface of the body mold 230 facing the side surface of the light guide plate 400 includes an upper face 234 and a lower face 236 spaced apart by the opening 232. The upper face 234 is an upper portion of the surface of the body mold 230 with respect to the opening 232, and the lower face 236 is a lower portion of the surface of the body mold 230 with respect to the opening 232. Alternatively, the surface of the body mold 230 may include only the upper face 234.

A width W1 of the opening 232 along the first direction may be the same as or larger than a width of the light emitting chip 220 along the first direction. Since the light emitting chip 220 leans toward the first long side with respect to the central axis along the first direction of the power supply plate 210, a width W2 of the upper face 234 along the first direction may be larger than a width W3 of the lower face 236 along the first direction. A thickness TW of the body mold 230 along the first direction may be the same as or larger than the width of one of the first and second main body portions 212a and 214a. The thickness TW of the body mold 230 may be defined by the sum of the width W2 of the upper face 234, the width W3 of the lower face 236, and the width W1 of the opening 232.

In an exemplary embodiment, the width W1 of the opening 232 may be about 0.1 mm, the width W2 of the upper face 234 may be about 0.27 mm, and the width W3 of the lower face 236 may be about 0.03 mm. Therefore, the width TW of the body mold may be about 0.4 mm.

The thickness of the light guide plate 400 and the thickness of the optical member 500 will be described as follows when they are compared with the thickness of the light source module 200.

The thickness of the light guide plate 400 corresponds to the width of the light emitting chip 220 along the first direction. The thickness of the light guide plate 400 may correspond to the height of the side surface of the light guide plate 400. For example, the thickness of the light guide plate 400 may be the same as or larger than the width of the light emitting chip 220.

Alternatively, the thickness of the light guide plate 400 may correspond to a sum of the width W1 of the opening 232 and the width W3 of the lower face 236. For example, the thickness of the light guide plate 400 may be the same as or larger than the sum of the width W1 of the opening 232 and the width W3 of the lower face 236.

Total thickness of the light guide plate 400 and the optical member 500 may be the same as or smaller than the width TW of the body mold 230. At this time, the thickness of the optical member 500 may be the same as or smaller than the width W2 of the upper face 234.

Figure 6:
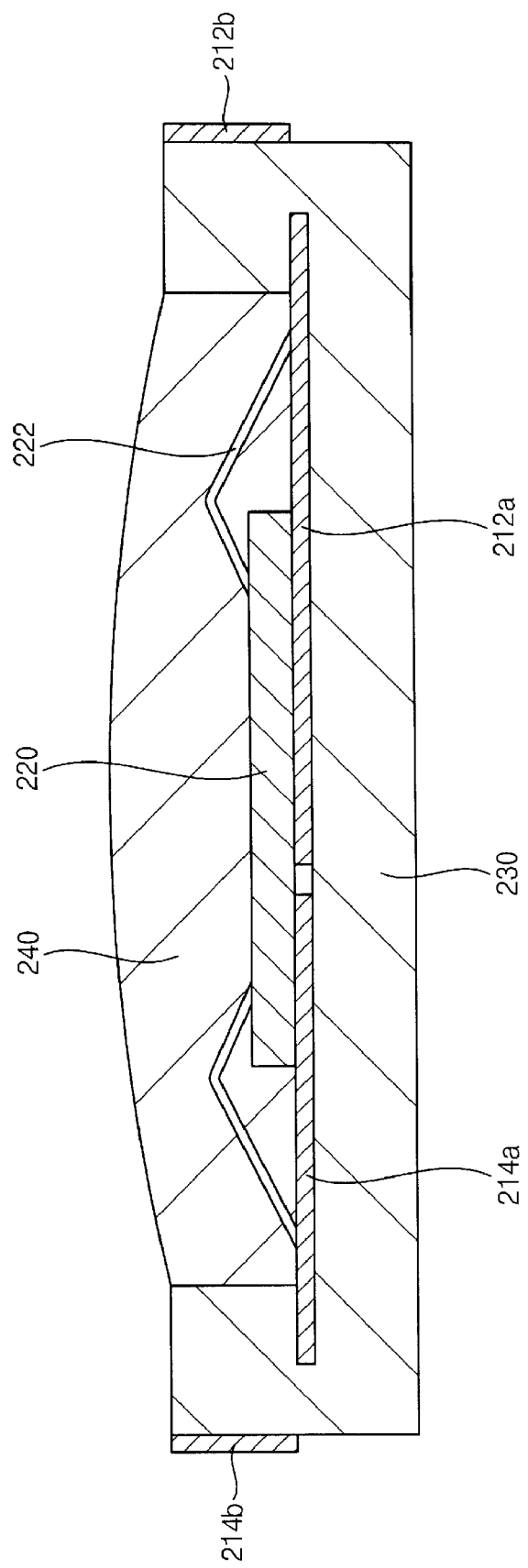
FIG. 6 is a cross-sectional view illustrating an exemplary light source module according to another exemplary embodiment of the present invention.

FIG. 6 is a cross-sectional view illustrating an exemplary light source module according to another exemplary embodiment of the present invention.

Referring to FIGS. 2, 4, and 6, the light source module 200 may further include a fluorescent material 240. The opening 232 of the body mold 230 is filled with the fluorescent material 240. The fluorescent material 240 covers the light emitting chip 220. The fluorescent material 240 may further cover the connection wires 222 and exposed portions of the power supply plate 210 and the body mold 230. The fluorescent material 240 may change light generated by the light emitting chip 220 into white light.

For example, when the light emitting chip 220 includes the blue LED generating blue light, the fluorescent material 240 may include a yellow phosphor.

Figure 7:
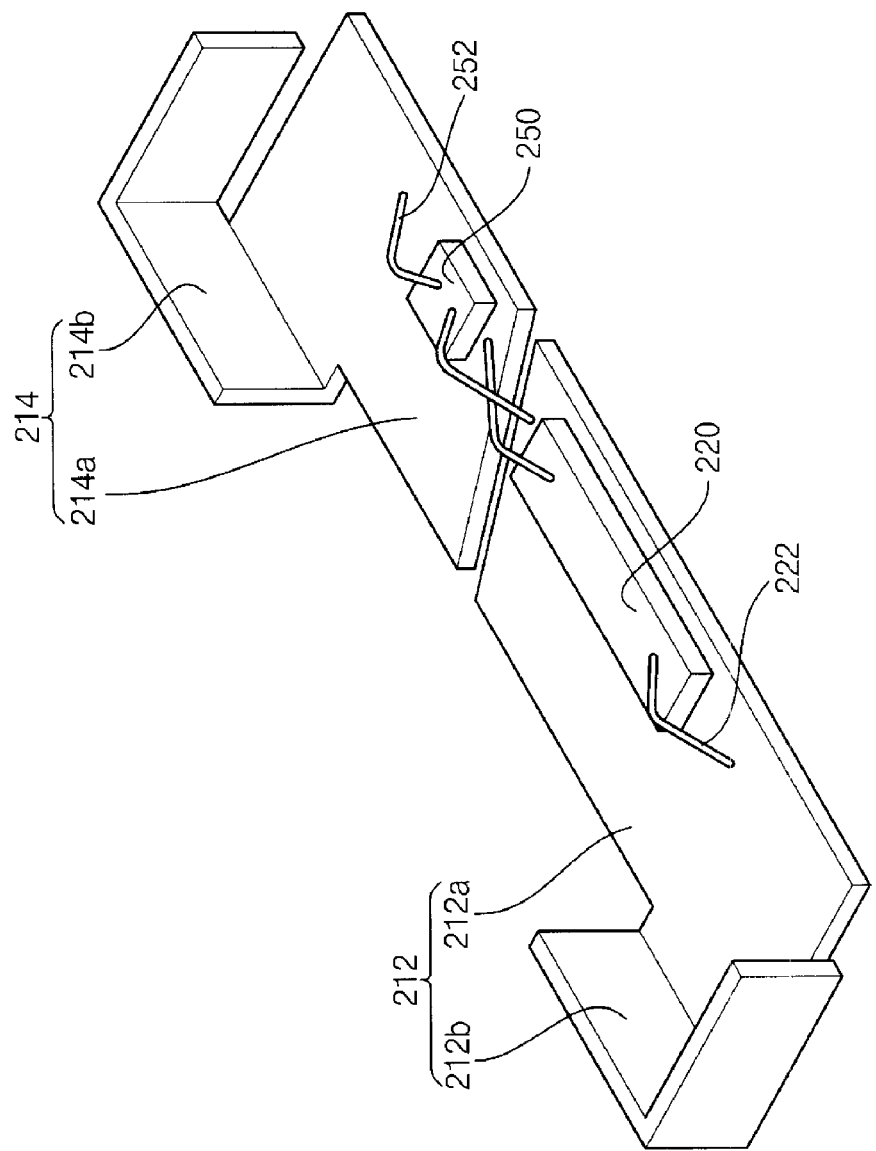
FIG. 7 is a perspective view illustrating an exemplary light source module according to still another exemplary embodiment of the present invention.

FIG. 7 is a perspective view illustrating an exemplary light source module according to still another exemplary embodiment of the present invention.

Referring to FIGS. 2, 3 and 7, the light source module 200 may further include a Zener diode 250. The Zener diode 250 is electrically connected to the power supply plate 210 and prevents the light emitting chip 220 from receiving an extra-voltage.

The Zener diode 250 may be connected to the light emitting chip 220 in parallel so as to be electrically connected to the first and second main body portions 212a and 214a. For example, the Zener diode 250 may be electrically connected to the first and second main body portions 212a and 214a through a pair of wires 252, respectively. When the light emitting chip 220 is disposed on one of the first and second main body portions 212a and 214a, the Zener diode 250 may be disposed on the other of the first and second main body portions 212a and 214a. In an exemplary embodiment, the Zener diode 250 may be disposed on the second main body portion 214a, a first wire 252 may connect the Zener diode 250 to the second main body portion 214a, and a second wire 252 may span the separation space SS and connect the Zener diode 250 to the first main body portion 212a. Likewise, the light emitting chip 220 may be disposed on the first main body portion 212a, a first connection wire 222 may connect the light emitting chip 220 to the first main body portion 212a, and a second connection wire 222 may span the separation space SS and connect the light emitting chip 220 to the second main body portion 214a.

When the light emitting chip 220 is disposed to lean toward the long side with respect to the central axis of the power supply plate 210 along the first direction, a thickness of the light guide plate 400 may decrease. That is, when the light emitting chip 220 is disposed off-center on the power supply plate 210 and adjacent to one long side of the power supply plate 210, a thickness of the light guide plate 400 may decrease.

When the side surface of the optical member 500 faces the upper face 234 of the body mold 230 and the thickness of the optical member 500 is the same as or smaller than the width W2 of the upper face 234, a thickness of the backlight assembly BL may decrease.

Further, when the flexible circuit board 300 adheres to the lower surface of the display panel 100, the light source module 200 is prevented from being moved by an external impact.

According to the present invention, the light emitting chip is disposed to lean to the long side with respect to the central axis along the first direction of the power supply plate. Therefore, the thickness of the light guide plate may decrease so that the thickness of the display apparatus may decrease.

Further, the flexible circuit board adheres to the lower surface of the display panel. Therefore, the light source module disposed on the flexible circuit board is prevented from being moved by the external impact.

Having described the exemplary embodiments of the present invention and their advantages, it is noted that various changes, substitutions and alterations can be made herein without departing from the spirit and scope of the invention as defined by appended claims.

What is claimed is:

1. A light source module comprising: a power supply plate defined by a first long peripheral side and an opposite second long peripheral side that are longer than a first shorter peripheral side and an opposite second shorter peripheral side joining the first and second long peripheral sides;
   a light emitting chip disposed on the power supply plate to lean closer to the first long peripheral side of the power supply plate with respect to a center of the power supply plate along a first direction than to the second long peripheral side of the power supply plate, the light emitting chip being electrically connected to the power supply plate; and
   a body mold connected with the power supply plate,
   wherein the body mold has an opening to expose the light emitting chip and a center of the light emitting chip is disposed in a central portion between side edges opposite to and facing each other in the first direction defining the opening.

2. The light source module of claim 1, wherein the power supply plate is extended in a second direction substantially perpendicular to the first direction.

3. The light source module of claim 2, wherein the power supply plate comprises:
   a first power supply plate applying a first voltage to the light emitting chip; and
   a second power supply plate spaced apart from the first power supply plate toward the second direction, the second power supply plate applying a second voltage different from the first voltage to the light emitting chip.

4. The light source module of claim 3, wherein the first power supply plate comprises:
   a first main body electrically connected to the light emitting chip; and
   a first sub body connected to the first main body to receive the first voltage from an external device, and
   the second power supply plate comprises:
   a second main body spaced apart from the first main body toward the second direction and electrically connected to the light emitting chip; and
   a second sub body connected to the second main body to receive the second voltage from the external device.

5. The light source module of claim 4, wherein a width of each of the first and second main bodies along the first direction is about 0.25 mm to about 0.4 mm, and a width of the light emitting chip along the first direction is about 0.075 mm to about 0.125 mm.

6. The light source module of claim 5, wherein total length along the second direction of the first and second main bodies of the power supply plate is in a range of about 3 mm to about 4 mm.

7. The light source module of claim 1, further comprising a Zener diode electrically connected to the power supply plate to prevent the light emitting chip from receiving an extra-voltage.

8. A backlight assembly comprising:
   a light source module comprising:
     a power supply plate defined by a first long peripheral side and an opposite second long peripheral side that are longer than a first shorter peripheral side and an opposite second shorter peripheral side joining the first and second long peripheral sides;
     a light emitting chip disposed on the power supply plate to lean closer to the first long peripheral side of the power supply plate with respect to a center of the power supply plate along a first direction than to the second long peripheral side of the power supply plate, the light emitting chip being electrically connected to the power supply plate; and
     a body mold connected with the power supply plate, and
   a light guide plate including a side surface facing the light emitting chip and receiving light generated by the light emitting chip, and a light exiting surface through which the light received through the side surface exits from the light guide plate,
   wherein the body mold has an opening to expose the light emitting chip and a center of the light emitting chip is disposed in a central portion between side edges opposite to and facing each other in the first direction defining the opening.

9. The backlight assembly of claim 8, wherein the power supply plate is extended in a second direction substantially perpendicular to the first direction.

10. The backlight assembly of claim 9, wherein a thickness of the light guide plate is substantially same as or larger than a width of the light emitting chip along the first direction.

11. The backlight assembly of claim 9, wherein a thickness of the light guide plate is substantially same as or larger than a width of an opening formed through the body mold along the first direction.

12. The backlight assembly of claim 9, further comprising at least one optical sheet disposed on the light guide plate to improve optical properties of light emitted from the light guide plate,
wherein a total thickness of the optical sheet and the light guide plate is same as or smaller than a width of the light source module along the first direction.

13. The backlight assembly of claim 9, further comprising a flexible circuit board electrically connected to the light source module to provide the light source module with an electric power.

14. The backlight assembly of claim 13, wherein the flexible circuit board is disposed at a second side of the power supply plate opposite to the first side of the power supply plate on which the light emitting chip is disposed and faces the body mold.

15. A display apparatus comprising:
a display panel displaying an image using light; and
backlight assembly comprising:
a light source module including:
a power supply plate defined by a first long peripheral side and an opposite second long peripheral side that are longer than a first shorter peripheral side and an opposite second shorter peripheral side joining the first and second long peripheral sides;
a light emitting chip disposed on the power supply plate to lean closer to the first long peripheral side of the power supply plate with respect to a center of the power supply plate along a first direction than to the second long peripheral side of the power supply plate, the light emitting chip being electrically connected to the power supply plate; and
a body mold connected with the power supply plate; and
a light guide plate including a side surface facing the light emitting chip and receiving light generated by the light emitting chip, and a light exiting surface through which the light received through the side surface exits from the light guide plate toward the display panel,
wherein the body mold has an opening to expose the light emitting chip and a center of the light emitting chip is disposed in a central portion between side edges opposite to and facing each other in the first direction defining the opening.

16. The display apparatus of claim 15, wherein the backlight assembly further comprises a flexible circuit board electrically connected to the light source module to provide the light source module with an electric power, and the flexible circuit board is disposed at a second side of the power supply plate opposite to the first side of the power supply plate on which the light emitting chip is disposed and faces the body mold.

17. The display apparatus of claim 16, wherein the flexible circuit board adheres to a lower surface of the display panel to be fixed to the display panel.

18. The display apparatus of claim 15, wherein a thickness of the light guide plate is substantially same as or larger than a width of an opening formed through the body mold along the first direction.

19. The display apparatus of claim 15, wherein the backlight assembly further comprises at least one optical sheet disposed on the light guide plate to improve optical properties of light emitted from the light guide plate, and
wherein a total thickness of the optical sheet and the light guide plate is same as or smaller than a width of the light source module along the first direction.

20. A method of reducing a thickness of a backlight assembly, the method comprising:
providing a power supply plate defined by a first light peripheral side and an opposite second long peripheral side that are longer than a first shorter peripheral side and an opposite second shorter peripheral side joining the first and second long peripheral sides;
disposing a light emitting chip on the power supply plate to lean closer to the first long peripheral of the power supply plate with respect to a center of the power supply plate along a first direction than to the second long peripheral side of the power supply plate;
surrounding the power supply plate with a body mold; and,
arranging a light guide plate adjacent the opening in the body mold, a thickness of the light guide plate being less than the width of the body mold,
wherein the body mold has an opening to expose the light emitting chip and a center of the light emitting chip is disposed in a central portion between side edges opposite to and facing each other in the first direction defining the opening.

* * * * *